(12) United States Patent
Kawabata et al.

(10) Patent No.: US 7,075,834 B2
(45) Date of Patent: Jul. 11, 2006

(54) SEMICONDUCTOR INTEGRATED CIRCUIT DEVICE

(75) Inventors: Kuninori Kawabata, Kawasaki (JP); Akira Kikutake, Kawasaki (JP); Shinichiro Shiratake, Yokohama (JP)

(73) Assignees: Fujitsu Limited, Kawasaki (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/994,610

(22) Filed: Nov. 28, 2001

(65) Prior Publication Data

US 2002/0067647 A1 Jun. 6, 2002

(30) Foreign Application Priority Data

Dec. 5, 2000 (JP) .............................. 2000-370056

(51) Int. Cl.
G11C 7/00 (2006.01)
G11C 7/02 (2006.01)
G11C 7/10 (2006.01)

(52) U.S. Cl. ............ 365/191; 365/189.08; 365/189.11; 365/201; 365/203; 365/214

(58) Field of Classification Search ................ 365/203, 365/201, 189.05, 230.06, 189.08, 191, 195, 365/196, 214, 189.11
See application file for complete search history.

(56) References Cited

U.S. PATENT DOCUMENTS

| 4,079,332 | A | * | 3/1978 | Padgett | 330/253 |
| 4,388,705 | A | * | 6/1983 | Sheppard | 365/210 |
| 4,758,986 | A | * | 7/1988 | Kuo | 365/186 |
| 4,766,473 | A | * | 8/1988 | Kuo | 365/185.1 |
| 4,773,047 | A | * | 9/1988 | Uchino et al. | 365/181 |
| 4,783,764 | A | * | 11/1988 | Tsuchiya et al. | 365/185.21 |
| 4,823,322 | A | * | 4/1989 | Miyatake et al. | 365/190 |
| 4,878,101 | A | * | 10/1989 | Hsieh et al. | 365/185.12 |
| 5,022,004 | A | * | 6/1991 | Kurtze et al. | 365/189.07 |
| 5,060,196 | A | * | 10/1991 | Pae et al. | 365/189.05 |
| 5,280,601 | A | * | 1/1994 | Desai et al. | 711/5 |
| 5,305,261 | A | * | 4/1994 | Furutani et al. | 365/189.01 |
| 5,526,506 | A | * | 6/1996 | Hyatt | 711/111 |
| 5,777,491 | A | * | 7/1998 | Hwang et al. | 326/113 |
| 5,805,513 | A | * | 9/1998 | Takahashi et al. | 365/201 |
| 5,894,448 | A | * | 4/1999 | Amano et al. | 365/230.08 |
| 6,563,730 | B1 | * | 5/2003 | Poplevine et al. | 365/154 |
| 2002/0194424 | A1 | * | 12/2002 | Hasegawa et al. | 711/104 |

FOREIGN PATENT DOCUMENTS

EP 183232 A * 6/1986
EP 375121 A * 6/1990

* cited by examiner

*Primary Examiner*—Amir Zarabian
*Assistant Examiner*—Ly Duy Pham
(74) *Attorney, Agent, or Firm*—Arent Fox PLLC

(57) ABSTRACT

A semiconductor device includes signal lines over which signals are transferred, and a drive circuit driving the signal lines in operating modes. The operating modes include a dynamic operation mode in which the signal lines are precharged, and a static operation mode in which the signal lines are not precharged.

6 Claims, 6 Drawing Sheets

US 7,075,834 B2

SEMICONDUCTOR INTEGRATED CIRCUIT DEVICE

BACKGROUND OF THE INVENTION

1. Field of the Invention

The present invention generally relates to semiconductor integrated circuit devices, and more particularly, to driving of a signal line provided therein.

2. Description of the Related Art

It has been required that a semiconductor memory device, which is one of semiconductor integrated circuit devices, operates at a higher frequency as a CPU (Central Processing Device) operates at a higher frequency. In order to raise the operating frequency, a static operation is preferable to a dynamic operation. Generally, the dynamic operation includes two steps. The first step is to precharge a signal line to a high level (H) (or a low level (L)). The second step subsequent to the first step is to precharge the signal line again in such a manner that the signal line is set at L (H) when a signal to be transferred is at H (L). The static operation consists of a single step of driving the signal line to H or L based on the signal to be transferred.

FIG. 1A shows the dynamic operation, and FIG. 1B shows the static operation.

The dynamic operation shown in FIG. 1A shows a case where the signal line is precharged to H. In the state in which the signal line has been precharged, the signal line is driven based on the level of the signal to be transferred. Two steps, namely, the driving step and the precharging step are needed during a period T. As indicated by NG in FIG. 1A, the dynamic operation has a disadvantage in that the precharge operation is not completed during a cycle T when the frequency of the transferred signal is high (the cycle T is reduced to T'). Hereinafter, a mode for the dynamic operation is referred to as a dynamic mode.

The static operation shown in FIG. 1B only drives the signal line on the basis of the transferred signal during the cycle T'. Since the precharge operation is not needed, the static operation is suitable for transmission of high-frequency signals. A mode for the static operation is referred to as a static mode.

A semiconductor memory device having both the dynamic and static modes is known. Data is read out in the high-speed static mode, while the semiconductor memory device is tested in the dynamic mode. An example of the above semiconductor memory device is illustrated in FIG. 2.

FIG. 2 is a circuit diagram of a data bus via which data is read from a memory cell, and its peripheral circuits. Referring to FIG. 2, data bus lines DB0–DB3 (which may be referred to as signal lines) of the data bus are used in a normal operation mode, and test-dedicated data bus lines TDB0 and TDB1 (paired) are used in a test operation mode. The normal operation mode is the static mode for transferring the signal at high speed (bit rate). The test operation mode is the dynamic mode because there is no need to drive the test-dedicated data bus lines TDB0 and TDB1 at high frequencies.

A drive circuit 10 is provided to the data bus lines DB0–DB3 and the test-dedicated data bus lines TDB0 and TDB1. A precharge circuit 12 is provided to the test-dedicated data bus lines TDB0 and TDB1. The precharge circuit 12 is needed because the test-dedicated data bus lines TDB0 and TDB1 are driven in the dynamic mode.

The drive circuit 10 drives the data bus lines DB0–DB3 and the test-dedicated data bus line TDB0 and TDB1 on the basis of complementary read data RDc and RDt read from sense amplifiers 24 and a test mode signal TST. The sense amplifiers 24 are connected to pairs of bit lines extending from a memory cell array (internal circuit) 22. The drive circuit 10 includes NMOS transistors 14, 16 and 20, a PMOS transistor 18, a NAND gate 26, NOR gates 30 34 and 48, and inverters 28, 32, 36 and 40. The above NMOS is an abbreviation of Negative-channel Metal Oxide Semiconductor, and PMOS is an abbreviation of Positive-channel Metal Oxide Semiconductor. The precharge circuit 12 includes a NAND gate 42 and PMOS transistors 44 and 46. Although omitted for the sake of simplicity, for each of the sense amplifiers 24 (for each memory cell), provided are the NAND gate 26, NOR gates 20, 34 and 38, and the inverters 28, 32, 26 and 40.

The memory cell array 22 includes a plurality of memory cells arranged in a matrix formation. The pairs of bit lines extending from the respective memory cells are connected to the corresponding sense amplifiers 24. FIG. 2 shows only four sense amplifiers 24. Inverters, each composed of a corresponding one of the PMOS transistors 18 and a corresponding one of the NMOS transistors 20 of the drive circuit 10, are connected to the data bus lines DB0–DB3, as shown in FIG. 2. A part indicated by "*" in FIG. 2 corresponds to four sense amplifiers 24. Read data RDc and RDt on the pair of bit lines extending from the sense amplifier 24 and the test mode signal TST are applied to the drive circuit 10 as shown.

In the normal operation, the test mode signal TST is at L. Depending on the levels of the read data RDc and RDt, one of the PMOS transistors 18 and the NMOS transistor 20 is turned ON, and the transistor switched to ON drives the corresponding data bus line to H or L.

A description will now be given of a data compression test using the test-dedicated data bus lines TDB0 and TDB1. The data compression test puts a plurality of data bits (memory cells) together and tests these data bits. Then, resultant complementary data is referred to and it is determined whether there is an error in any of the plurality of memory cells. If no error is found, one of the test-dedicated data buses TDB0 and TDB1 is switched to H and the other to L. In contrast, if there is an error in even any one of the data bits, both the test-dedicated data bus lines TDB0 and TDB1 become L.

The data compression test is performed in the state in which the test mode signal TST is at H and a precharge signal PCG applied to the NAND gate 42 of the precharge circuit 12 is at H. In this state, the NAND gate 42 outputs L, which turns ON the PMOS transistors 44 and 46. Thus, the test-dedicated data bus lines TDB0 and TDB1 are precharged to H (a level of a power supply voltage VDD). When the test mode signal TST switches to H from L, the NAND gate 26 and the NOR gate 30 of the drive circuit 10 are disabled, while the NOR gates 34 and 38 are enabled. Since the NAND gate 26 and the NOR gate 30 are disabled, the data bus lines DB0–DB3 are not driven.

When the normal complementary read data RDc and RDt are obtained from an activated memory cell, one of the RDc and RDt is switched to L and the other to H. The read data RDc and RDt associated with a memory cell that is not enabled are both at L. Thus, the NMOS transistors 14 and 16 of the drive circuit associated with the memory cell that is not enabled are both OFF. Depending on the read data RDc and RDt from an enabled memory cell, one of the NMOS transistors 14 and 16 is ON, and the corresponding one of the test-dedicated data bus lines TDB0 and TDB1 is driven to L from H.

Now, the following is assumed. Data H is written into the memory cells connected to the four sense amplifiers 24 and is read (a wired-OR operation on the data is made) to the test-dedicated data bus lines TDB0 and TDB1 via the corresponding circuit * of the drive circuit 10. Thus, it is determined whether there is an error on the enabled-cell basis (on the circuit * basis). The four sense amplifiers 24 are associated with a group of memory cells that can be segmented by an specific address. In the above assumption, a circuit part ** related to another address and similar NMOS transistors 14 and 16 that are not shown are all OFF.

If there is no error with data H being written into the memory cells, read data RDt are at H, and the related NMOS transistors are all turned ON, so that the test-dedicated data bus line TDB0 is driven to L. In contrast, the NMOS transistors 16 are all OFF, and the test-dedicated data bus line TDB1 is maintained at the precharge level H. That is, if there is no error, one of the test-dedicated data bus lines TDB0 and TDB1 are at H and the other at L. If there is an error in even one of the four memory cells, the H/L relation between the read data RDc and RDt is reversed. In this case, the corresponding NMOS transistors 16 are turned ON and drive the test-dedicated data bus line TDB1 to L. Thus, both the test-dedicated data bus lines TDB0 and TDB1 are at L. In the above-mentioned manner, the presence of error can be identified.

If there is no error when L is written into the memory cells, all the NMOS transistors 14 are turned OFF, and all the NMOS transistors 16 are turned ON. Thus, the test-dedicated data bus lines TDB0 and TDB1 are set at H and L, respectively. If there is an error in even one of the memory cells, the test-dedicated data bus line TDB0 is switched to L. Thus, error can be identified.

However, the conventional circuitry shown in FIG. 2 has the following disadvantages. In a case where the data bus lines DB0–DB3 that are used in the normal operation mode are operated in the static mode, there is a need to additionally and separately provide the pair of test-dedicated data bus lines TDB0 and TDB1 that are operated in the dynamic mode. Further, the drive circuit 10 needs a modification with a larger number of circuit elements. This modification needs a larger chip area and prevents increase in the integration density.

SUMMARY OF THE INVENTION

A general object of the present invention is to provide a semiconductor integrated circuit device in which the above disadvantages are eliminated.

A more specific object of the present invention is to provide a semiconductor integrated circuit device in which a circuit for driving signals has a reduced configuration and the chip area occupied by the circuit can be reduced.

The above objects of the present invention are achieved by a semiconductor device comprising:

signal lines over which signals are transferred; and a drive circuit driving the signal lines in operating modes, the operating modes including a dynamic operation mode in which the signal lines are precharged, and a static operation mode in which the signal lines are not precharged.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

First, the principles of the present invention are described with reference to FIG. 3.

Figure 1A:
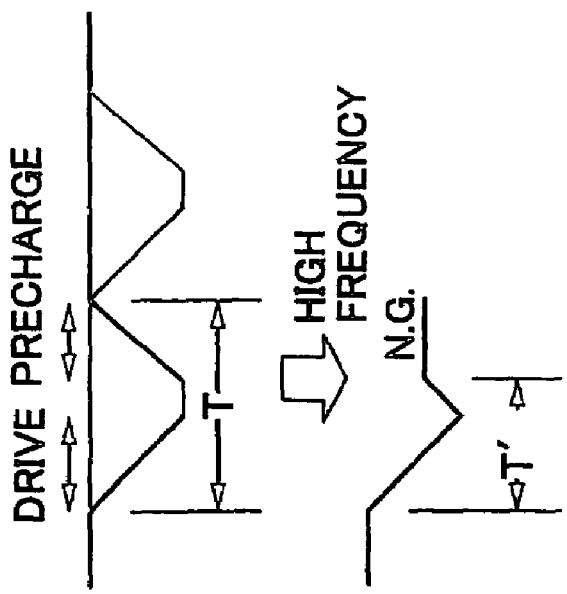
FIGS. 1A and 1B are respectively diagrams of static and dynamic operations of a signal line.
Figure 1B:
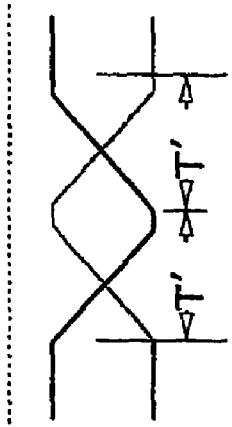
Figure 2:
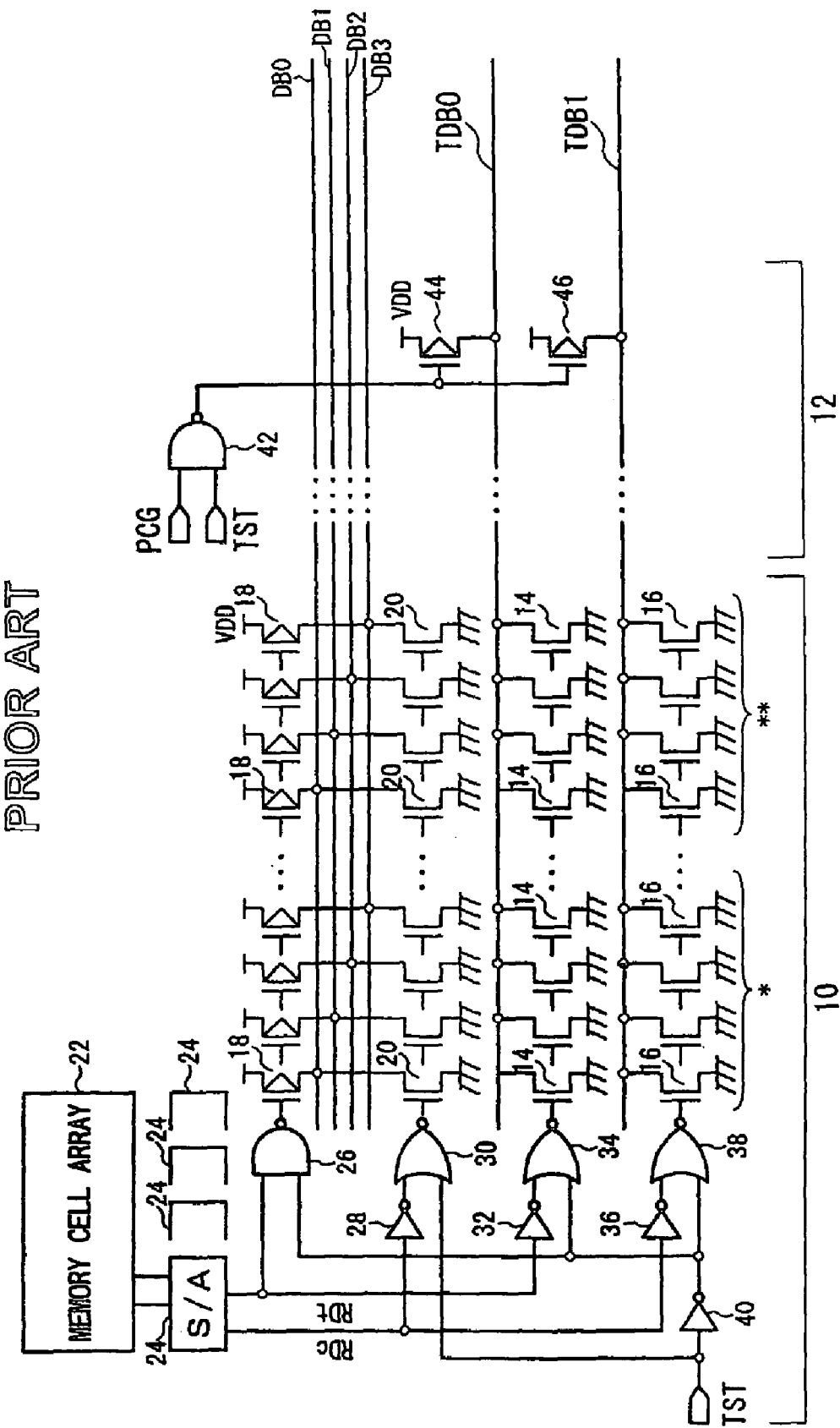
FIG. 2 is a circuit diagram of a conventional semiconductor memory device.
Figure 3:
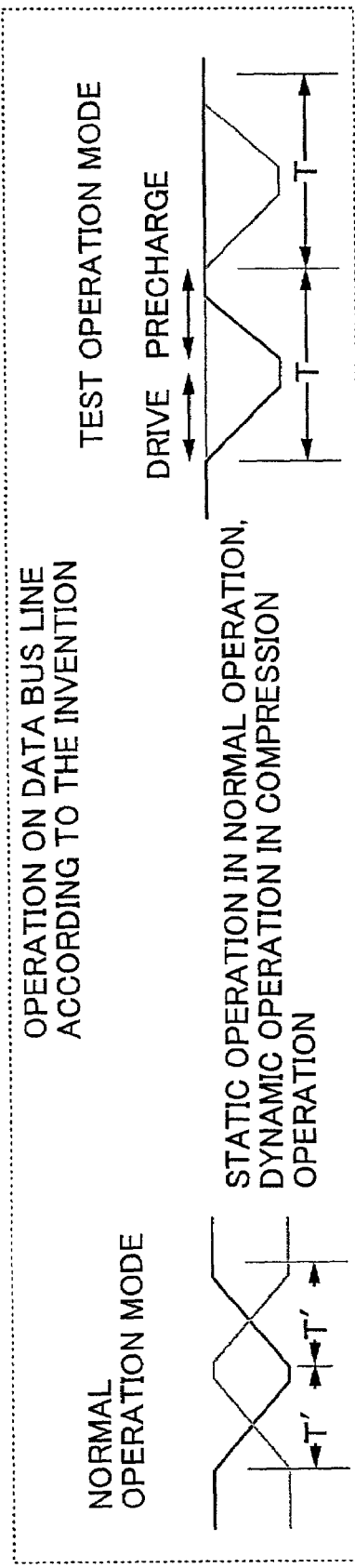
FIG. 3 is a diagram of the principles of the present invention.

FIG. 3 shows how the data bus lines DB0–DB3 shown in FIG. 2 are driven. In the present invention, the data bus lines DB0–DB3 are driven in both the normal operation mode and the test operation mode (data compression test). The data bus lines DB0–DB3 are driven in the static mode when the normal operation mode is selected, and are driven in the dynamic mode when the test operation mode is selected. In the normal operation mode, a transition takes place only once in the cycle T', and the state in the previous cycle is maintained. In contrast, in the test operation mode, a transition takes place twice in the cycle T (<T'). More particularly, one of the two transitions takes place when the data bus lines DB0–DB3 are driven, and the other transition takes place when precharged.

Figure 4:
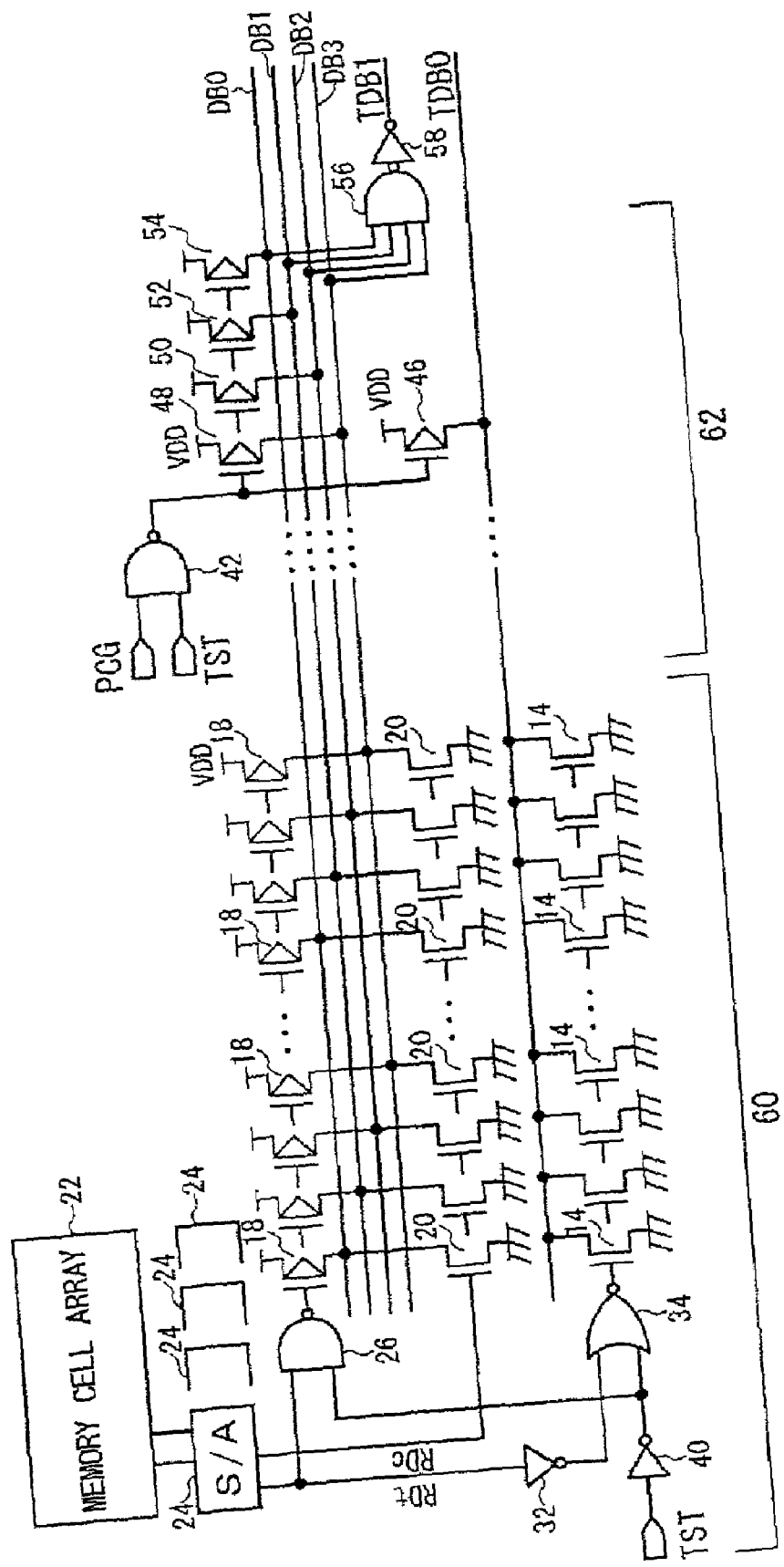
FIG. 4 is a circuit diagram of a semiconductor memory device according to a first embodiment of the present invention.

FIG. 4 is a circuit diagram of a semiconductor integrated circuit device according to a first embodiment of the present invention. Any part shown in FIG. 4 that is the same as a part shown in FIG. 2 is denoted by the same reference numeral in both figures. In the circuitry shown in FIG. 4, a drive circuit 60 and a precharge circuit 62 is equipped with only the test-dedicated data bus line TDB0, and is not equipped with the test-dedicated data bus line TDB1 used in FIG. 2. In the configuration shown in FIG. 4, the data bus lines DB0–DB3 play the role of the test-dedicated data bus line TDB1.

The drive circuit 60 is made up of NMOS transistors 14 and 20, a PMOS transistor 18, a NAND gate 26, a NOR gate 34 and inverters 32 and 40.

The precharge circuit 62 is made up of a NAND gate 42, and PMOS transistor 46, 48, 50, 52 and 54. In the configuration shown in FIG. 4, the data bus lines DB0–DB3 play the role of the test-dedicated data bus line TDB1. That is, the data bus lines DB0–DB3 are driven in the dynamic operation. For this driving, the PMOS transistors 54, 52, 50 and 48 act to precharge the data bus lines DB0, DB1, DB2 and DB3 to H in the test operation mode.

The NAND gate 56 performs a NAND operation on data items on the data bus lines DB0–DB3. The NAND gate 56 corresponds to the wired-OR operation on the test-dedicated data bus line TDB0, and compresses data. The inverter 58 inverts the output of the NAND gate 56. The output signal of the inverter 58 forms the test-dedicated data bus line TDB1.

In the normal operation mode, the test mode signal TST is at L, and the precharge signal PCG is at L. Since the precharge signal PCG is at L, the precharge transistors 46, 48, 50, 52 and 54 are all OFF. Further, because the test mode signal is at L, the NOR gate 34 is in the disabled state, and the NMOS transistor 14 is OFF. Also, since the test mode signal TST is at L, the NAND gate 26 is in the enabled state. When data RDt and RDc that are read by the sense amplifier 24 in complementary fashion re at H and L, respectively, the PMOS transistor 18 is turned ON, and the NMOS transistor 20 is turned OFF. Thus, the corresponding data bus line (which may, for example, be DB0) is set at H. If data RDt and RDc that are read by the sense amplifier 24 are at L and H, respectively, the PMOS transistor 18 is turned OFF and the NMOS transistor 20 is turned ON. Thus, the corresponding data bus line (which may, for example, be DB0) is set at L.

In the test operation mode, the test mode signal TST changes from L to H, and the precharge signal PCG changes from L to H. Thus, the output of the NAND gate 42 is changed from H to L, and the precharge transistors 46, 48, 50, 52 and 54 are all turned ON. Therefore, the data bus lines DB0–DB3 and the test-dedicated data bus line TDB0 are precharged to H. When the test mode signal TST changes to H, the NAND gate 26 is changed to the disabled state, and the NOR gate 34 is changed to the enabled state. The NAND gate 26 is in the disabled state and thus outputs H. Thus, the PMOS transistors 18 are all turned OFF. That is, in the test operation mode, only the NMOS transistors 20 are used, while the PMOS transistors 18 are not used. That is, the dynamic operation is carried out in such a manner that, when data read from the memory cells are L, that is when read data RDc are at H, the data bus lines DB0–DB3 that have been precharged to H are driven to L.

A case is now considered where H is written into the memory cells connected to the four sense amplifiers 24, and is read in the data compression test. When the operation is normal, any of the data items RDc read from the memory cells are L, the corresponding transistors 20 are turned OFF. That is, the data bus lines DB0–DB3 are maintained in the H-precharged state. The NAND gate 56 compresses H-data items on the data bus lines DB0–DB3, and outputs L. The inverter 58 inverts the output signal of the NAND gate 56, and outputs H to the test-dedicated data bus line TDB1. Since all of the other read data items RDt are L, the output of the NOR gate 34 is changed to H, so that all the NMOS transistors 14 are turned ON. This changes the test-dedicated data bus line TDB0 to L.

If there is an error in any of the read data items, the read data RDc and RDt are at, for example, H and L, respectively. Since the read data RDc is L, the corresponding NMOS transistor 20 is turned ON, and the corresponding data bus line is changed from H to L. Thus, the output of the NAND gate 56 is changed from L to H, and the test-dedicated data bus line TDB1 is changed from H to L. As described above, if there is error in even one of the read data items, the test-dedicated data bus lines TDB0 and TDB1 are both at L.

A case is now considered where L is written into the memory cells connected to the four sense amplifiers 24, and is read in the data compression test. When the operation is normal, any of the read data items RDc is H, and the corresponding transistors 20 are turned ON. That is, the data bus lines DB0–DB3 are changed to L from H. The NAND gate 56 compresses the L-data items on the data bus lines DB0–DB3, and outputs H. The inverter 58 inverts the output of the NAND gate 56, and outputs L to the test-dedicated data bus line TDB1. Since all the other read data items RDt are L, the corresponding NMOS transistors are all turned OFF. Hence, the test-dedicated data bus line TDB0 is maintained in the H-precharged state.

If there is an error in any of the read data items, the read data RDc and RDt are at, for instance, L and H, respectively. Since the read data RDc is L, the corresponding NMOS transistor 20 is maintained in OFF, and the corresponding data bus line is maintained at H. In this case, since the NAND gate 56 is maintained at H, the corresponding NOR gate 34 is changed to H, so that the NMOS transistor 14 is turned ON. Thus, the test-dedicated data bus line TDB0 is changed from H to L. As described above, if there is error in even one of the read data items, the test-dedicated data bus lines TDB0 and TDB1 are both at L.

Figure 5:
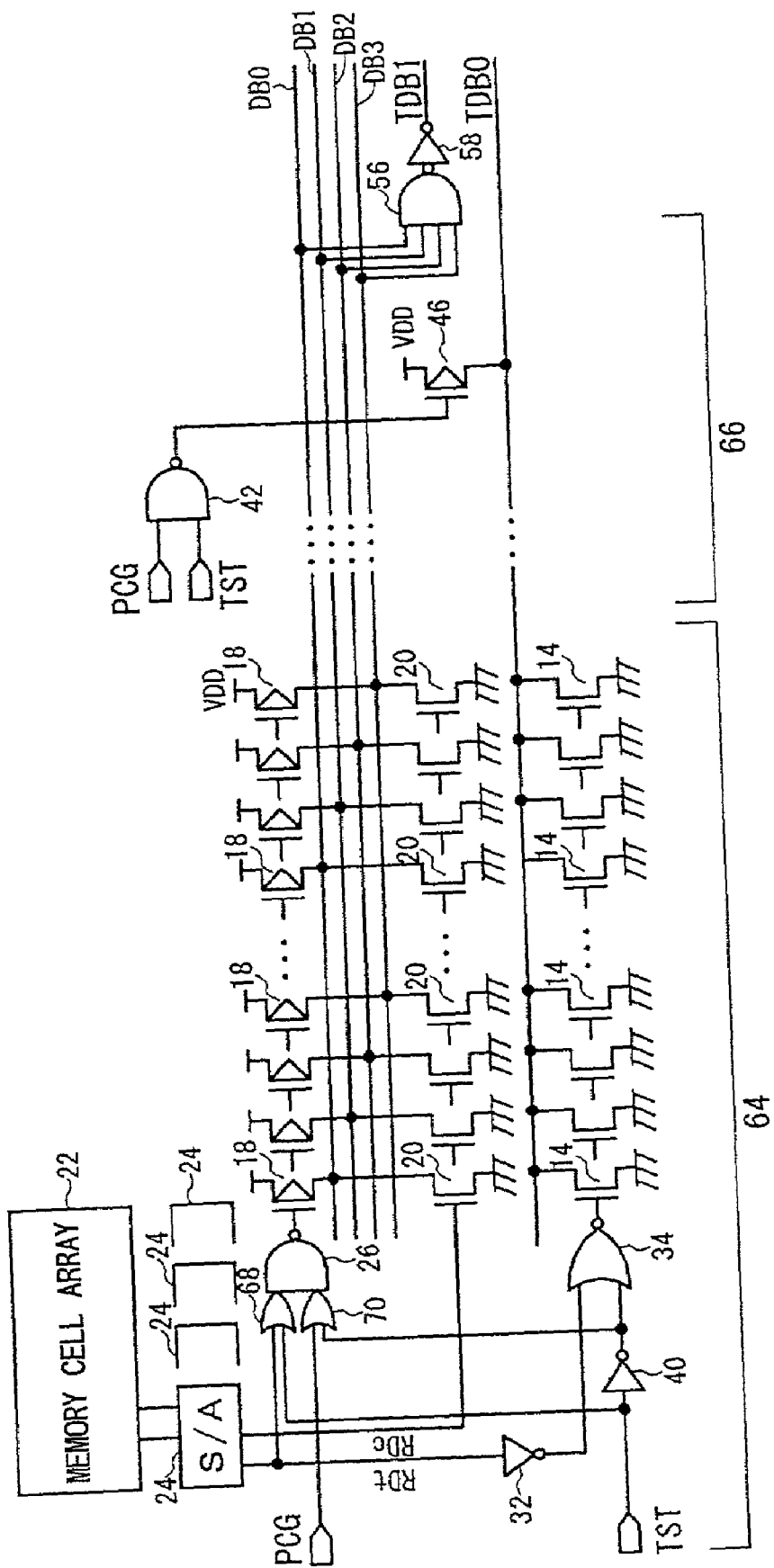
FIG. 5 is a circuit diagram of a semiconductor memory device according to a second embodiment of the present invention.

FIG. 5 is a circuit diagram of a semiconductor integrated circuit device according to a second embodiment of the present invention. In FIG. 5, parts that are the same as those shown in the previously described figures are given the same reference numerals. The circuit shown in FIG. 5 has a unique arrangement in which the PMOS transistors 18 originally used for driving the data bus lines DB0–DB3 are also used for precharging.

The circuit shown in FIG. 5 is equipped with a drive/precharge circuit 64, and a precharge circuit 66. The precharge circuit 66 precharges the test-dedicated data bus line TDB0, and includes the aforementioned NAND gate 42 and the PMOS transistor 46.

The drive/precharge circuit 64 uses the PMOS transistors 18 for precharging, and therefore includes OR gates 68 and 70 provided at the inputs of the NAND gate 26. The OR gate 68 makes an OR operation on the read data RDt and the test mode signal TST. The OR gate 70 makes an OR operation on the precharge signal PCG and the test mode signal TST.

In the normal operation mode, the test mode signal TST and the precharge signal PCG are both at L. The test mode signal TST at L is inverted by the inverter 40, and is applied to the OR gate 70, which then outputs H. Thus, the NAND gate 26 is enabled. If the read data RDt is H, the output of the NAND gate 26 is switched to L, and the corresponding PMOS transistor 18 is turned ON. If the read data RDt is L, the output of the NAND gate 26 is switched to H, and the corresponding PMOS transistor 18 is turned OFF.

In the test operation mode, the test mode signal TST changes to H from L. Next, the precharge signal PCG changes from L to H. Thus, the NAND gate 26 outputs L, and all PMOS transistors 18 are turned ON. Therefore, the data bus lines DB0–DB3 are precharged to H.

As described above, the PMOS transistors 18 act as not only driving transistors but also precharging transistors. The precharge circuit 66 is configured so as to precharge the test-dedicated data bus line TDB0 only.

The operations of the circuit shown in FIG. 5 are the same as those that have been described with reference to FIG. 4, and therefore a description thereof is omitted here.

Figure 6:
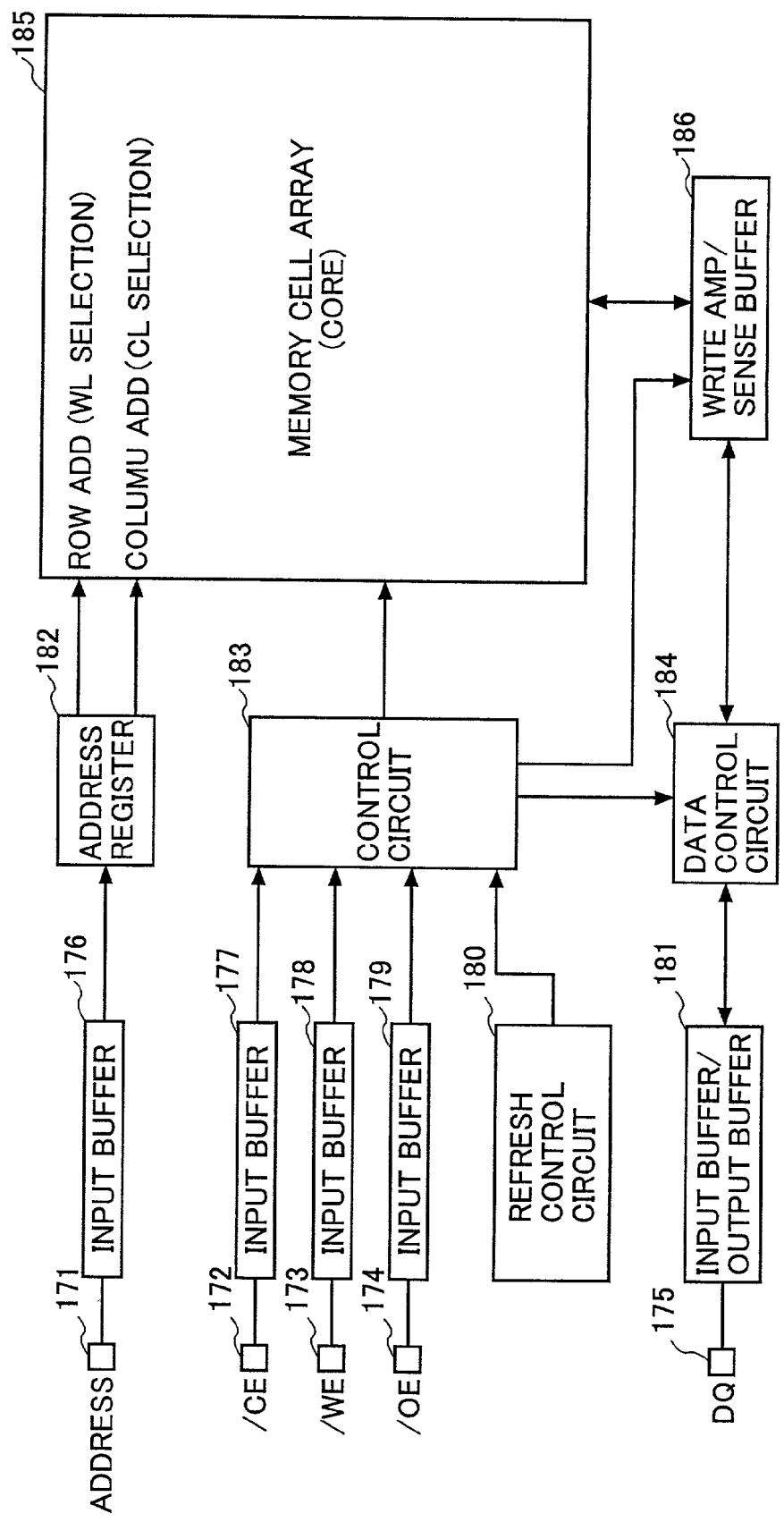
FIG. 6 is a block diagram of an overall structure of a semiconductor memory device including a circuit shown in FIG. 4 or FIG. 5.

FIG. 6 is a block diagram of an overall structure of a semiconductor memory device having the circuit shown in FIG. 4 or 5. The memory device shown in FIG. 6 includes an address terminal 171, command input terminals 172–174, a data input/output terminal 175, input buffers 176–179 connected to the terminals 171–174, respectively, and a refresh control circuit 180 controls a refresh operation. The device includes an input buffer/output buffer 181, an address register 182, a circuit 183, a data control circuit 184, a core circuit (memory cell array) 185, and a write amplifier/sense buffer 186.

An external address is received via the address terminal 171 and the input buffer 176, and is applied to the address register 182. Then, decoded addresses of the row and column systems are supplied to the memory cell array 185. The control circuit 183 is supplied with a chip enable signal /CE, a write enable signal /WE, and an output enable signal /OE via input buffers 177, 178 and 179, respectively. The data input/output circuit 184 controls data input/output under the control of the control circuit 183, which produces various control signals based on the received signals. Input data applied to the terminal 175 is applied to the write amplifier/sense amplifier 186 via the input/output buffer 181 and the data control circuit 184, and is written into the memory cell array 185. Data read from the memory cell array 185 by the write amplifier/sense buffer 186 is output from the terminal 175 via the data control circuit 184 and the input/output buffer 181.

A refresh control signal generated by the refresh control circuit 180 is applied to the control circuit 183, which controls the memory cell array 185 in a refresh mode.

The circuit shown in FIG. 4 or FIG. 5 may be provided in the memory cell array 185 so that a plurality of identical circuits may be arranged in the matrix formation.

The present invention is not limited to the specifically disclosed embodiments, and variations and modifications may be made without departing from the scope of the invention.

The present application is based on Japanese Priority Application No. 2000-370056 filed on Dec. 5, 2000, the entire contents of which are hereby incorporated by reference.

What is claimed is:

1. A semiconductor device, comprising:
   an internal circuit configured to supply two signals that are complementary with each other to represent a single value in a first operation mode and capable of assuming either different signal levels or an identical signal level in a second operation mode;
   a first data line;
   a second data line; and
   a drive circuit configured to set, in the first operation mode, the first data line to a signal level responsive to said single value represented by the two complementary signals, and configured to set, in the second operation mode, the first data line to a signal level responsive to one of the two signals and the second data line to a signal level responsive to another one of the two signals after precharging the first and second data lines,
   wherein the first operation mode is a read mode and the second operation mode is a test mode.

2. The semiconductor device as claimed in claim 1, further comprising a memory cell array to which said first data line and said second data line are connected, data read from the memory cell array being transferred over said first data line and said second data line.

3. The semiconductor device as claimed in claim 1, further comprising a test-dedicated line,
   wherein a predetermined test of the semiconductor device is performed using said test-dedicated line and said data lines.

4. The semiconductor device as claimed in claim 3, further comprising a test result output circuit receiving said data lines at inputs thereof and outputting a test result, said test result and a logic level of said test-dedicated line forming a result of said predetermined test.

5. The semiconductor device as claimed in claim 3, further comprising a precharge circuit precharging said first data line, and said second data line.

6. The semiconductor device as claimed in claim 5, said precharge circuit precharging said first data line, said second data line and said test-dedicated line in said first operation mode only.

* * * * *